(12) United States Patent
Kosaka et al.

(10) Patent No.: US 11,061,319 B2
(45) Date of Patent: *Jul. 13, 2021

(54) PHOTOMASK BLANK AND MAKING METHOD

(71) Applicant: Shin-Etsu Chemical Co., Ltd., Tokyo (JP)

(72) Inventors: Takuro Kosaka, Joetsu (JP); Tsuneo Terasawa, Joetsu (JP); Shigeo Irie, Joetsu (JP); Takahiro Kishita, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 15/996,926

(22) Filed: Jun. 4, 2018

(65) Prior Publication Data

US 2018/0356721 A1     Dec. 13, 2018

(30) Foreign Application Priority Data

Jun. 13, 2017     (JP) ............................. JP2017-115879

(51) Int. Cl.
    *G03F 1/38*     (2012.01)
    *G03F 1/84*     (2012.01)
(52) U.S. Cl.
    CPC ..... *G03F 1/38* (2013.01); *G03F 1/84* (2013.01)
(58) Field of Classification Search
    CPC ..... G03F 1/38; G03F 1/46; G03F 1/48; G03F 1/80; G03F 1/84
    See application file for complete search history.

(56) References Cited

U.S. PATENT DOCUMENTS

| 10,564,537 | B2* | 2/2020 | Kosaka | G03F 1/32 |
| 2004/0229136 | A1* | 11/2004 | Kaneko | G03F 1/54 |
| | | | | 430/5 |
| 2005/0170655 | A1* | 8/2005 | Bencher | G03F 1/46 |
| | | | | 430/5 |
| 2005/0170665 | A1* | 8/2005 | Sugita | H01L 27/10852 |
| | | | | 438/780 |

(Continued)

FOREIGN PATENT DOCUMENTS

| EP | 2 863 258 A2 | 4/2015 |
| EP | 3 139 213 A2 | 4/2015 |

(Continued)

OTHER PUBLICATIONS

Microlithography Technical abstract summary digest (Feb. 2006).*
European Search Report for Appl. No. 18175166.0 dated Oct. 8, 2018.

*Primary Examiner* — Martin J Angebrandt
(74) *Attorney, Agent, or Firm* — Birch, Stewart, Kolasch & Birch, LLP

(57) ABSTRACT

A photomask blank is processed into a transmissive photomask for use in photolithography for forming a pattern on a recipient using exposure light. The photomask blank comprises a transparent substrate, a first film of a material which is etchable by chlorine/oxygen-based dry etching, and a second film of a silicon-containing material. The second film includes a layer having a refractive index n of at least 1.6 or an extinction coefficient k of at least 0.3 with respect to the wavelength of inspection light which is longer than the exposure light.

18 Claims, 2 Drawing Sheets

(56) References Cited

U.S. PATENT DOCUMENTS

| | | | | |
|---|---|---|---|---|
| 2007/0212619 A1* | 9/2007 | Yoshikawa | ............... | G03F 1/80 |
| | | | | 430/5 |
| 2008/0102379 A1* | 5/2008 | Wu | ........................ | G03F 1/26 |
| | | | | 430/5 |
| 2010/0081066 A1* | 4/2010 | Nozawa | .................... | G03F 1/32 |
| | | | | 430/5 |
| 2012/0276474 A1* | 11/2012 | Yamauchi | ................ | G03F 1/82 |
| | | | | 430/5 |
| 2015/0086908 A1* | 3/2015 | Inazuki | .................... | G03F 1/50 |
| | | | | 430/5 |
| 2017/0068158 A1* | 3/2017 | Terasawa | ............ | G01N 21/956 |
| 2017/0123305 A1 | 5/2017 | Watanabe et al. | | |
| 2018/0164675 A1* | 6/2018 | Chang | ....................... | G03F 1/32 |
| 2018/0267398 A1* | 9/2018 | Irie | ......................... | G03F 1/46 |

FOREIGN PATENT DOCUMENTS

| JP | 63-85553 A | 4/1988 |
|---|---|---|
| JP | 7-49558 A | 2/1995 |
| JP | 2011-211083 A | 10/2011 |
| WO | WO 2016/140044 A1 | 9/2016 |

\* cited by examiner

US 11,061,319 B2

PHOTOMASK BLANK AND MAKING METHOD

CROSS-REFERENCE TO RELATED APPLICATION

This non-provisional application claims priority under 35 U.S.C. § 119(a) on Patent Application No. 2017-115879 filed in Japan on Jun. 13, 2017, the entire contents of which are hereby incorporated by reference.

TECHNICAL FIELD

This invention relates to photomask blanks from which photomasks for use in the microfabrication of semiconductor integrated circuits or the like are produced, and a method for preparing the photomask blank.

BACKGROUND ART

In the semiconductor technology field, research and development efforts continue for further miniaturization of circuit patterns. Recently, a challenge to higher integration of large-scale integrated circuits places increasing demands for further miniaturization of circuit patterns, size reduction of wiring patterns, and miniaturization of contact hole patterns for cell-constructing inter-layer connections. As a consequence, in the manufacture of photomasks for use in the photolithography of forming such fine patterns, a technique capable of accurately writing finer circuit patterns or mask patterns is needed to meet the miniaturization demand.

In general, the photolithography adopts reduction projection in forming patterns on semiconductor substrates. Thus the photomask pattern typically has a size of about 4 times the size of a pattern to be formed on the semiconductor substrate. In the currently prevailing photolithography, a circuit pattern to be written has a size far smaller than the wavelength of light used for exposure. If a photomask pattern which is a mere 4-time magnification of the circuit feature is used, the desired shape is not transferred to the resist film on semiconductor substrate due to influences such as optical interference occurring during exposure.

To mitigate such influences as optical interference, in some cases, the photomask pattern is designed to a more complex shape than the actual circuit pattern. For example, the so-called optical proximity correction (OPC) is applied to the actual circuit pattern to design a complex pattern shape. Besides, various techniques such as modified illumination, immersion lithography, and double-patterning lithography are applied to meet the demands for pattern miniaturization and high accuracy.

Photomask patterns are formed, for example, by furnishing a photomask blank having a light-shielding film on a transparent substrate, forming a photoresist film on the blank, writing a pattern with EB, developing to form a resist pattern, and etching the light-shielding film through the resist pattern serving as an etching mask, to form a light-shielding pattern. In an attempt to miniaturize the light-shielding pattern, if it is processed while maintaining the thickness of the resist film the same as before miniaturization, a ratio of film thickness to pattern size, known as aspect ratio, becomes high. Then the profile of resist pattern is degraded, pattern transfer fails and sometimes, the resist pattern collapses or strips off. The resist film must be thinned in compliance with size reduction.

One of prior art attempts to mitigate the burden on resist film during dry etching is the use of a hard mask. For example, Patent Document 1 discloses the steps of forming a $SiO_2$ film on a $MoSi_2$ film and dry etching the $MoSi_2$ film with a chlorine-containing gas while using the $SiO_2$ film as the etching mask. It is described that the $SiO_2$ film also functions as an antireflective film. Also Patent Document 2 describes that a light-shielding film of chromium is formed on a phase shift film and a $SiO_2$ film is formed thereon as a hard mask.

CITATION LIST

Patent Document 1: JP-A S63-085553
Patent Document 2: JP-A H07-049558

SUMMARY OF INVENTION

A photomask is prepared from a photomask blank having a hard mask film by first forming a mask pattern in the hard mask film, and etching an underlying optical functional film such as a light-shielding film or phase shift film, with the mask pattern of the hard mask film serving as an etching mask, for thereby transferring the mask pattern of the hard mask film to the optical functional film. In this course, if the hard mask film contains pinhole defects penetrating through the film in thickness direction, the penetrating pinhole defects are transferred intactly to the optical functional film, becoming defects in the mask pattern of the optical functional film. In the defect inspection of the hard mask film, it is critical to detect penetrating pinhole defects.

On the other hand, a thinner hard mask film is preferable from the standpoint of pattern size reduction. The thinner the film, the more difficult it becomes to detect penetrating pinhole defects. From the standpoint of defect formation in a resist film (resist pattern) on the hard mask film during development, a $SiO_2$ film is preferred as the hard mask film. However, materials like $SiO_2$ have low optical constants including refractive index n and extinction coefficient k. It is difficult to detect penetrating pinhole defects in a film of low optical constant material.

The invention pertains to a photomask blank comprising an optical functional film and a hard mask film of silicon-containing material disposed contiguous thereto. An object of the invention is to provide a photomask blank including a hard mask film which enables positive detection of penetrating pinhole defects, and a method for preparing the same.

In connection with a photomask blank which is processed into a transmissive photomask for use in photolithography for forming a pattern on a recipient using exposure light of wavelength up to 200 nm, comprising a transparent substrate, a first film formed of a material which is etchable by chlorine/oxygen-based dry etching with a gas mixture of chlorine and oxygen gases and resistant against fluorine-based dry etching with a fluorine-containing gas, and a second film formed of a silicon-containing material which is not substantially etched during the chlorine/oxygen-based dry etching of the first film, the inventors have found that the object is attained when the second film is composed of a single layer or multiple layers including at least one layer having a refractive index n of at least 1.6 or an extinction coefficient k of at least 0.3 as an optical constant with respect to the wavelength of inspection light used in a defect inspection step, which is longer than the wavelength of exposure light. With this construction, the photomask blank comprising a hard mask film of silicon-containing material disposed contiguous to an optical functional film becomes a photomask blank including a hard mask film which enables positive detection of penetrating pinhole defects.

In one aspect, the invention provides a photomask blank which is processed into a transmissive photomask for use in photolithography for forming a pattern on a recipient using exposure light of wavelength up to 200 nm, the photomask blank comprising a transparent substrate, a first film disposed on the substrate and formed of a material which is etchable by chlorine/oxygen-based dry etching with a gas mixture of chlorine and oxygen gases and resistant against fluorine-based dry etching with a fluorine-containing gas, and a second film disposed contiguous to the first film and formed of a silicon-containing material which is not substantially etched during the chlorine/oxygen-based dry etching of the first film. The second film is composed of a single layer or multiple layers including at least one layer having a refractive index n of at least 1.6 or an extinction coefficient k of at least 0.3 with respect to the wavelength of inspection light used in a defect inspection step, which is longer than the exposure light.

In a preferred embodiment, the second film has a thickness of 2 nm to 20 nm.

In a preferred embodiment, the silicon-containing material of the second film is silicon alone, a silicon-containing compound containing silicon and at least one light element selected from oxygen, nitrogen and carbon, or a transition metal/silicon-containing compound containing silicon, at least one light element selected from oxygen, nitrogen and carbon, and up to 20 at % of a transition metal. Typically the light element comprises oxygen and/or nitrogen.

In a preferred embodiment, the second film is composed of multiple layers, and the difference in refractive index n with respect to inspection light wavelength between a layer having the highest refractive index and a layer having the lowest refractive index is at least 0.5, or the difference in extinction coefficient k with respect to inspection light wavelength between a layer having the highest extinction coefficient and a layer having the lowest extinction coefficient is at least 0.3.

In a preferred embodiment, in the second film, a layer disposed remotest from the first film has a total content of oxygen and nitrogen and a layer disposed contiguous to the first film has a total content of oxygen and nitrogen, the former content being higher than the latter content.

Often the defects are penetrating pinhole defects. Typically, the exposure light is ArF excimer laser light and the inspection light has a wavelength of up to 600 nm.

The invention also provides a method for preparing the photomask blank, comprising the step of inspecting the photomask blank for defects at the inspection light wavelength.

Advantageous Effects of Invention

The photomask blank comprising a hard mask film of silicon-containing material disposed on an optical functional film makes it possible to detect penetrating pinhole defects in the hard mask film.

DESCRIPTION OF PREFERRED EMBODIMENTS

The photomask blank of the invention is processed into a transmissive photomask which is used in photolithography for forming a pattern on a recipient using exposure light of wavelength up to 200 nm. As used herein, the exposure light is light used in exposure through the photomask. In conjunction with the photomask blank and photomask of the invention, the exposure light is preferably ArF excimer laser light of wavelength 193 nm.

Figure 1:
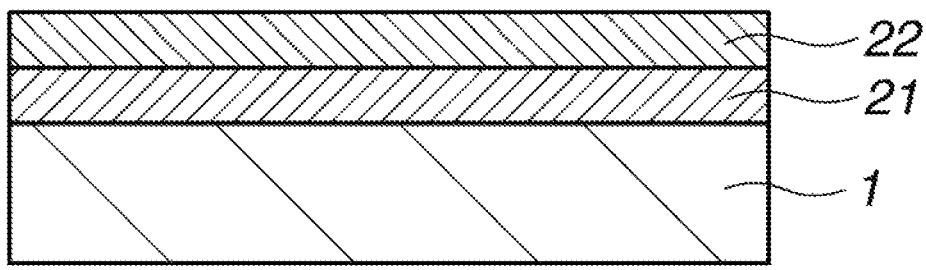
FIG. 1 is a cross-sectional view of a photomask blank in one embodiment of the invention.

One embodiment of the invention is a photomask blank comprising a transparent substrate, a first film disposed on the substrate, and a second film disposed contiguous to the first film. In a photomask blank as shown in FIG. 1, a first film 21 and a second film 22 are formed in order on a transparent substrate 1.

The transparent substrate is typically a quartz substrate which is transparent at the exposure wavelength although the type and size of the substrate are not particularly limited. Preference is given to transparent substrates of 6 inch squares and 0.25 inch thick, known as 6025 substrate, as prescribed in the SEMI standards, or transparent substrates of 152 mm squares and 6.35 mm thick when expressed in the SI units.

Figure 2:
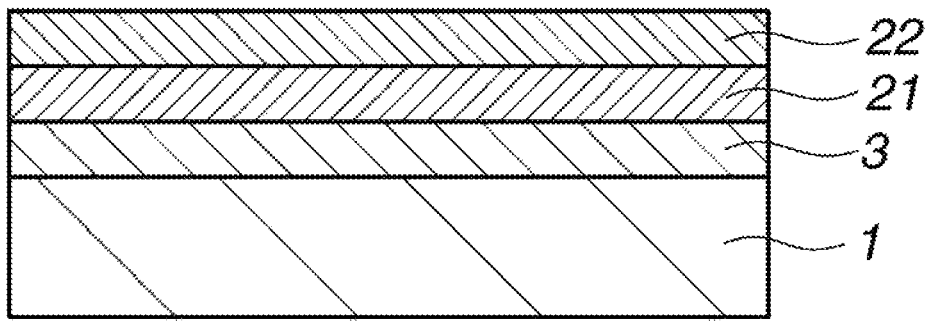
FIG. 2 is a cross-sectional view of a photomask blank in another embodiment of the invention.

The first film may be formed either contiguous to the transparent substrate (i.e., in direct contact with the substrate) or on the transparent substrate via an intervening film such as phase shift film. In one exemplary photomask blank, as shown in FIG. 2, another film (third film) 3, a first film 21, and a second film 22 are formed in order on a transparent substrate 1. The other film is preferably formed of a material having different etching properties from the first film, especially a material which is etchable with fluorine-based dry etching with a fluorine-containing gas, but resistant against chlorine/oxygen-based dry etching with a gas mixture of chlorine and oxygen gases, typically a silicon-containing material. The other film may be composed of a single layer or multiple layers.

The first film is formed of a material which is etchable by chlorine/oxygen-based dry etching with a gas mixture of chlorine and oxygen gases, but resistant against fluorine-based dry etching with a fluorine-containing gas. Suitable materials include chromium alone, and chromium compounds, for example, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

In the embodiment wherein the first film is a film of a chromium compound, the chromium content is preferably at least 30 at %, especially at least 40 at % and less than 100 at %, especially up to 90 at %. Also preferably, the oxygen content is at least 0 at %, especially at least 1 at % and up to 60 at %, especially up to 40 at %; the nitrogen content is at least 0 at %, especially at least 1 at % and up to 50 at %, especially up to 40 at %; the carbon content is at least 0 at %, especially at least 0.1 at % when an etching rate must be adjusted, and up to 20 at %, especially up to 10 at %. The total content of chromium, oxygen, nitrogen and carbon is preferably at least 95 at %, more preferably at least 99 at %, and especially 100 at %.

The first film may be composed of a single layer or multiple layers. Where the first film is a single layer, it may be a homogeneous layer having a constant composition in thickness direction or a compositionally graded layer having a composition continuously graded in thickness direction.

Where the first film is composed of multiple layers, it may be a combination of at least one homogeneous layer and/or at least one graded layer, for example, a combination of homogeneous layers, a combination of graded layers, or a combination of a homogeneous layer and a graded layer. In the graded layer, the content of a certain element may increase or decrease in thickness direction.

The (total) thickness of the first film is preferably at least 20 nm, more preferably at least 40 nm, and up to 100 nm, more preferably up to 70 nm. The first film is preferably constructed as an optical functional film such as a light-shielding film or antireflective film. The first film may also function as a hard mask (or etching mask) during etching of the transparent substrate or the other film (as mentioned above) on the substrate.

The second film is formed of a silicon-containing material which is not substantially etched during the chlorine/oxygen-based dry etching of the first film, i.e., chlorine/oxygen-based dry etching with a gas mixture of chlorine and oxygen gases. Preferably the material of the second film is etchable by fluorine-based dry etching with a fluorine-containing gas.

For the film, typically hard mask film, which functions as an etching mask for any film disposed on the substrate side, the detection of penetrating pinholes is important. The step of detecting defects in the photomask blank preparing process generally uses inspection light having a longer wavelength than the exposure light (light used in exposure through the photomask). When the exposure light is ArF excimer laser, a wavelength in a range of up to 600 nm, for example, 213 nm, 355 nm, 488 nm or 532 nm is selected as the inspection light. A defect inspection system using inspection light of such wavelength is commercially available as model M6640 (inspection wavelength 532 nm) or M8350 (inspection wavelength 355 nm) from Lasertec Corp. It is believed that as the photomask pattern is further miniaturized in the future, the inspection light wavelength for defect inspection will shift toward shorter wavelength side for improving the detection sensitivity of microscopic defects.

In the step of detecting defects, especially penetrating pinhole defects in a photomask blank, the detection sensitivity of microscopic defects is affected by optical constants of a film including refractive index n and extinction coefficient k. In the inventive photomask blank, the second film is composed of a single layer or multiple layers including at least one layer having a refractive index n of at least 1.6 or an extinction coefficient k of at least 0.3 with respect to the wavelength of inspection light used in the defect inspection step, which is longer than the exposure light. Higher values of refractive index n and extinction coefficient k are preferable. From the standpoint of defect detection, a refractive index n of at least 1.7 and an extinction coefficient k of at least 0.5 are preferred. Most often, the refractive index n is up to 7 and the extinction coefficient k is up to 6.

Typical of the silicon-containing material of which the second film is formed is silicon alone. Elemental silicon having high values of refractive index n and extinction coefficient k is the most effective material from the standpoint of defect detection. Also suitable as the silicon-containing material are silicon-containing compounds, for example, silicon-containing compounds containing silicon and at least one light element selected from oxygen, nitrogen, and carbon, such as silicon oxide (SiO), silicon nitride (SiN), silicon carbide (SiC), silicon oxynitride (SiON), silicon oxycarbide (SiOC), silicon nitride carbide (SiNC), and silicon oxide nitride carbide (SiONC), and transition metal/silicon-containing compounds containing silicon, at least one light element selected from oxygen, nitrogen, and carbon, and a transition metal (Me), such as transition metal silicon oxide (MeSiO), transition metal silicon nitride (MeSiN), transition metal silicon carbide (MeSiC), transition metal silicon oxide nitride (MeSiON), transition metal silicon oxide carbide (MeSiOC), transition metal silicon nitride carbide (MeSiNC), and transition metal silicon oxide nitride carbide (MeSiONC). The transition metal (Me) is at least one element selected from among titanium (Ti), vanadium (V), cobalt (Co), nickel (Ni), zirconium (Zr), niobium (Nb), molybdenum (Mo), hafnium (Hf), tantalum (Ta), and tungsten (W).

In the embodiment wherein the silicon-containing material of the second film is a silicon-containing compound, the silicon content is preferably at least 20 at %, more preferably at least 33 at % and up to 95 at %, more preferably up to 80 at %. Also preferably, the oxygen content is at least 0 at %, specifically at least 1 at % when an etching rate must be adjusted, especially at least 20 at % and up to 70 at %, especially up to 66 at %; the nitrogen content is at least 0 at %, especially at least 1 at % and up to 50 at %, especially up to 30 at %; the carbon content is at least 0 at %, especially at least 1 at % and up to 20 at %, especially up to 10 at %. The total content of silicon, oxygen, nitrogen and carbon is preferably at least 95 at %, more preferably at least 99 at %, and especially 100 at %.

In the embodiment wherein the silicon-containing material of the second film is a transition metal/silicon-containing compound, the silicon content is preferably at least 20 at %, more preferably at least 33 at % and up to 90 at %, more preferably up to 80 at %. Also preferably, the oxygen content is at least 0 at %, specifically at least 1 at % when an etching rate must be adjusted, especially at least 20 at % and up to 70 at %, especially up to 66 at %; the nitrogen content is at least 0 at %, especially at least 1 at % and up to 50 at %, especially up to 30 at %; the carbon content is at least 0 at %, especially at least 1 at % and up to 20 at %, especially up to 10 at %. The transition metal content is up to 20 at %, preferably up to 15 at %, more preferably up to 10 at %. The total content of silicon, oxygen, nitrogen, carbon and transition metal is preferably at least 95 at %, more preferably at least 99 at %, and especially 100 at %.

The silicon-containing compound or transition metal/silicon-containing compound of the second film preferably contains one or both of oxygen and nitrogen as light element, more preferably oxygen.

The second film may be composed of a single layer or multiple layers, typically two to four layers. Where the second film is a single layer, it may be a homogeneous layer having a constant composition in thickness direction or a compositionally graded layer having a composition continuously graded in thickness direction. Where the second film is composed of multiple layers, it may be a combination of at least one homogeneous layer and/or at least one graded layer, for example, a combination of homogeneous layers, a combination of graded layers, or a combination of a homogeneous layer(s) and a graded layer(s). In the graded layer, the content of a certain element may increase or decrease in thickness direction. Also the compositionally graded layer is constructed such that refractive index n or extinction coefficient k may increase or decrease in thickness direction. From the standpoint of detection of penetrating pinhole defects, the overall second film or the graded layer of which the second film is composed is preferably constructed such that refractive index n or extinction coefficient k may decrease in a direction remote from the substrate.

Although the second film may be a single layer, it is preferred from the standpoints of an etching rate of a film and defect generation during film deposition that the second film be composed of multiple layers including at least one layer having a refractive index n of at least 1.6 or an extinction coefficient k of at least 0.3. In the embodiment wherein the second film is composed of multiple layers, it may consist of layers having specific values of refractive index n or extinction coefficient k. Alternatively, the second film may be a combination of a layer having a value of refractive index n or extinction coefficient k within the range and a layer having a value of refractive index n or extinction coefficient k outside the range, wherein the former layer is a layer contributing to an improvement in accuracy of defect inspection and the latter layer is a layer serving for another function other than the accuracy improvement of defect inspection. Then the overall second film has better functions.

It is preferred from the standpoints of adhesion to photoresist and development defects, for example, that the outermost layer (layer disposed remotest from the substrate) of the second film be silicon dioxide ($SiO_2$). However, since silicon dioxide has low values of refractive index n and extinction coefficient k with respect to the inspection light wavelength, the second film should preferably be composed of multiple layers including at least one layer having a refractive index n of at least 1.6 or an extinction coefficient k of at least 0.3.

In the embodiment wherein the second film is composed of multiple layers, it is preferred from the standpoint of improving the accuracy of defect inspection that the layer having a refractive index n of at least 1.6 or an extinction coefficient k of at least 0.3 account for at least 20%, more preferably at least 30% of the total thickness of the second film. It is also preferred from the standpoint of acquiring a function other than the accuracy improvement of defect inspection that the layer having a value of refractive index n or extinction coefficient k outside the range account for at least 40%, more preferably at least 50% of the total thickness of the second film.

In the embodiment wherein the second film is composed of multiple layers, the difference in refractive index n with respect to inspection light wavelength between a layer having the highest refractive index and a layer having the lowest refractive index is preferably at least 0.5, especially at least 0.7; or the difference in extinction coefficient k with respect to inspection light wavelength between a layer having the highest extinction coefficient and a layer having the lowest extinction coefficient is preferably at least 0.3, especially at least 0.5. In this preferred embodiment, the layer having the highest refractive index and the layer having the lowest refractive index, or the layer having the highest extinction coefficient and the layer having the lowest extinction coefficient may be disposed at any desired level in the second film. In the case of two-layer film, for example, of the layer having the highest refractive index and the layer having the lowest refractive index, or of the layer having the highest extinction coefficient and the layer having the lowest extinction coefficient, either one may be disposed adjacent to the substrate and the other be disposed remote from the substrate. In the case of three or multilayer film, of the layer having the highest refractive index and the layer having the lowest refractive index, or of the layer having the highest extinction coefficient and the layer having the lowest extinction coefficient, preferably either one is disposed adjacent to the substrate, especially most adjacent to the substrate and the other is disposed remote from the substrate, especially remotest from the substrate.

As alluded to previously, the silicon-containing compound or transition metal/silicon-containing compound of the second film preferably contains one or both of oxygen and nitrogen as light element, more preferably oxygen. In the embodiment wherein the second film is composed of multiple layers, the layers are preferably constructed such that the total content of oxygen and nitrogen in the layer disposed remotest from the first film is higher than the total content of oxygen and nitrogen in the layer disposed contiguous to the first film.

The second film has a sufficient thickness not to vanish during etching of the first film, although it is preferred from the standpoint of pattern formation that the second film be not too thick. In this regard, the (total) thickness of the second film is preferably at least 2 nm, more preferably at least 5 nm, and up to 20 nm, more preferably up to 10 nm. The second film is preferably formed as a hard mask film or etching mask film. At the later stage when the photomask blank is processed into a photomask, the second film may be completely removed, or left on the photomask, for example, an outer peripheral portion of the substrate as a film taking on part of the function of light-shielding film or antireflective film.

In the embodiment wherein the first film is formed on the transparent substrate via another film or third film intervening therebetween, the other film is formed of a silicon-containing material. Examples of the silicon-containing material include silicon-containing compounds, for example, silicon-containing compounds containing silicon and one or both of oxygen and nitrogen, such as silicon oxide (SiO), silicon nitride (SiN), silicon oxynitride (SiON), and transition metal/silicon compounds, for example, transition metal/silicon compounds containing silicon, at least one light element selected from oxygen, nitrogen, and carbon, and a transition metal (Me), such as transition metal silicon oxide (MeSiO), transition metal silicon nitride (MeSiN), transition metal silicon carbide (MeSiC), transition metal silicon oxide nitride (MeSiON), transition metal silicon oxide carbide (MeSiOC), transition metal silicon nitride carbide (MeSiNC), and transition metal silicon oxide nitride carbide (MeSiONC). The transition metal (Me) is at least one element selected from among titanium (Ti), vanadium (V), cobalt (Co), nickel (Ni), zirconium (Zr), niobium (Nb), molybdenum (Mo), hafnium (Hf), tantalum (Ta), and tungsten (W). Of these, molybdenum (Mo) is preferred from the standpoint of dry etching.

In the embodiment wherein the other film is a phase shift film, it may be either a full transmissive phase shift film or a halftone phase shift film, for example, having a transmittance of 5 to 30% with respect to exposure light. The phase shift film is generally formed to such a thickness as to provide a phase shift of at least 150°, preferably at least 170° and up to 200°, preferably up to 190°, typically a phase shift of about 180° with respect to exposure light during use of the photomask. Specifically, the other film preferably has a thickness of at least 50 nm, more preferably at least 55 nm and up to 80 nm, more preferably up to 75 nm.

In one embodiment wherein the first film in the form of a light-shielding film or a light-shielding film and antireflective film is directly formed on the transparent substrate, the photomask blank may be a binary photomask blank. In another embodiment wherein the first film is formed on the transparent substrate via the other film in the form of a phase shift film, the photomask blank may be a phase shift photomask blank. From the binary photomask blank, a binary photomask (or binary mask) may be manufactured.

From the phase shift photomask blank, a phase shift photomask (or phase shift mask) may be manufactured.

Preferably the single layer or each of the multiple layers of which the first film, second film or other film is composed is deposited by a sputtering technique because a fully homogeneous film is readily obtained. The sputtering technique may be either DC sputtering or RF sputtering. The target and sputtering gas are selected as appropriate depending on the desired value of refractive index or extinction coefficient, layer arrangement and composition. When the film is formed by reactive sputtering, the content of light element(s) may be adjusted by using a reactive gas as the sputtering gas and adjusting the flow rate thereof. Suitable reactive gases include oxygen-containing gas, nitrogen-containing gas and carbon-containing gas, for example, oxygen gas ($O_2$ gas), nitrogen gas ($N_2$ gas), nitrogen oxide gas (NO gas, $N_2O$ gas, $NO_2$ gas), and carbon oxide gas (CO gas, $CO_2$ gas). The sputtering gas contains an inert gas such as helium, neon or argon gas. The preferred inert gas is argon gas. The sputtering pressure is typically at least 0.01 Pa, preferably at least 0.03 Pa and up to 10 Pa, preferably up to 0.1 Pa.

When the film is composed of multiple layers, the layers may be deposited in different sputtering chambers or in a common sputtering chamber while changing sputtering conditions stepwise or continuously. From the standpoint of productivity, deposition in a common chamber is recommended. In this case, it is preferred for sputter deposition and deposit properties that deposition is controlled such that the content of light element(s) may increase with the progress of deposition, because the generation of particles during deposition is suppressed. This is also advantageous because of a possibility that a layer having the highest value of refractive index or extinction coefficient is disposed nearest to the substrate and a layer having the lowest value of refractive index or extinction coefficient is disposed remotest from the substrate.

When a film of chromium-containing material is deposited, the target may be selected from a chromium target and a target containing chromium and at least one element selected from oxygen, nitrogen and carbon, depending on the desired composition of the film. When a film of silicon-containing material is deposited, the target may be selected from a silicon target, transition metal target, and transition metal/silicon target, depending on the desired composition of the film.

When the photomask blank is prepared by the above-described method, the method should involve the step of inspecting the photomask blank for defects, especially penetrating pinhole defects, using inspection light of longer wavelength than exposure light. Then defects, especially penetrating pinhole defects in the photomask blank can be detected at a high sensitivity.

EXAMPLE

Examples and Comparative Examples are given below by way of illustration and not by way of limitation.

Example 1 and Comparative Example 1

In a chamber of a sputtering system, a 6025 quartz substrate of 152 mm squares and 6.35 mm thick was placed. By sputtering a Si target with argon and nitrogen gases, a phase shift film (third film) of SiN having a thickness of 60 nm was deposited directly on the transparent substrate. Next, by sputtering a Cr target with argon gas, a light-shielding film (first film) of Cr having a thickness of 54 nm was deposited on the phase shift film. Next, by sputtering a Si target with argon gas and optionally oxygen or nitrogen gas, a mono-layer hard mask film (second film) of silicon-containing material having a thickness of 10 nm was deposited on the light-shielding film.

Hard mask film samples #1 to #5 were prepared as a layer of silicon alone, a layer of silicon oxide (SiO), or a layer of silicon nitride (SiN) by suitably selecting the flow rate of oxygen or nitrogen gas, and sputtering under five different sets of conditions (condition sets 1 to 5). The hard mask film was analyzed for composition by X-ray photoelectron spectrometer XPS K-Alpha (Thermo Fisher Scientific). The optical constants (refractive index n, extinction coefficient k) of the hard mask film at several wavelengths were determined by a spectroscopic ellipsometer VUV-VASE Gen-II (J. A. Woollam Co.). The results are shown in Tables 1 and 2.

TABLE 1

| Sample | | | Refractive index n at wavelength | | | | |
|---|---|---|---|---|---|---|---|
| (condition set) | Composition | Atomic ratio | 193 nm | 213 nm | 355 nm | 488 nm | 532 nm |
| #1 | Si:O(SiO$_2$) | 33:67 | 1.561 | 1.535 | 1.474 | 1.460 | 1.458 |
| #2 | Si:O | 67:33 | 1.429 | 1.621 | 2.943 | 3.095 | 3.038 |
| #3 | Si | 100 | 0.883 | 1.119 | 5.657 | 4.367 | 4.159 |
| #4 | Si:N | 63:37 | 1.303 | 1.601 | 3.914 | 4.163 | 4.069 |
| #5 | Si:N | 46:54 | 2.612 | 2.529 | 2.113 | 2.052 | 2.042 |

TABLE 2

| Sample | | | Extinction coefficient k at wavelength | | | | |
|---|---|---|---|---|---|---|---|
| (condition set) | Composition | Atomic ratio | 193 nm | 213 nm | 355 nm | 488 nm | 532 nm |
| #1 | Si:O(SiO$_2$) | 33:67 | 0.000 | 0.000 | 0.000 | 0.000 | 0.000 |
| #2 | Si:O | 67:33 | 1.448 | 1.538 | 1.284 | 0.472 | 0.324 |
| #3 | Si | 100 | 2.778 | 3.025 | 3.019 | 0.079 | 0.043 |
| #4 | Si:N | 63:37 | 2.255 | 2.453 | 2.046 | 0.743 | 0.495 |
| #5 | Si:N | 46:54 | 0.356 | 0.162 | 0.000 | 0.000 | 0.000 |

Next, each of hard mask film samples #1 to #5 was inspected for penetrating pinhole defects having a diameter of 120 nm. The sensitivity of defect detection was evaluated by computing a contrast at inspection light wavelength 532 nm from simulation based on the measured refractive index n and extinction coefficient k of samples #1 to #5. The results are shown in Table 3.

TABLE 3

| Condition set 1 | Condition set 2 | Condition set 3 | Condition set 4 | Condition set 5 |
|---|---|---|---|---|
| 0.007 | 0.037 | 0.072 | 0.058 | 0.017 |

Example 2 and Comparative Example 2

In a chamber of a sputtering system, a 6025 quartz substrate of 152 mm squares and 6.35 mm thick was placed. By sputtering a Si target with argon and nitrogen gases, a phase shift film (third film) of SiN having a thickness of 60 nm was deposited directly on the transparent substrate. Next, by sputtering a Cr target with argon gas, a light-shielding film (first film) of Cr having a thickness of 54 nm was deposited on the phase shift film. Next, by sputtering a Si target with argon gas and optionally oxygen or nitrogen gas, a two-layer or mono-layer hard mask film (second film) of silicon-containing material was deposited on the light-shielding film.

Hard mask film samples #6 to #14 were prepared as a layer of silicon alone, a layer of silicon oxide (SiO), or a layer of silicon nitride (SiN) by suitably selecting the flow rate of oxygen or nitrogen gas, and sputtering under the same five condition sets as in Example 1 and Comparative Example 1. The hard mask film samples #6 to #13 were hard mask films of two-layer structure selected from (1) a surface side layer (i.e., layer remote from substrate) of 8 nm thick and a substrate side layer of 2 nm thick (overall thickness of hard mask film 10 nm), (2) a surface side layer of 3 nm thick and a substrate side layer of 2 nm thick (overall thickness of hard mask film 5 nm), and (3) a surface side layer of 5 nm thick and a substrate side layer of 5 nm thick (overall thickness of hard mask film 10 nm). The hard mask film sample #14 was a mono-layer hard mask film having an overall thickness of 10 nm or 5 nm. The layer construction of each sample is shown in Table 4.

TABLE 4

| | Sample | | | | | | | | |
|---|---|---|---|---|---|---|---|---|---|
| | #6 | #7 | #8 | #9 | #10 | #11 | #12 | #13 | #14 |
| Surface side layer | Condition set 1 | Condition set 1 | Condition set 1 | Condition set 1 | Condition set 3 | Condition set 4 | Condition set 2 | Condition set 5 | Condition set 1 |
| Substrate side layer | Condition set 3 | Condition set 4 | Condition set 2 | Condition set 5 | Condition set 1 | Condition set 1 | Condition set 1 | Condition set 1 | |

Next, each of hard mask film samples #6 to #14 was inspected for penetrating pinhole defects having a diameter of 120 nm. The sensitivity of defect detection was evaluated by computing a contrast at inspection light wavelength 532 nm from simulation based on the measured refractive index n and extinction coefficient k under condition sets 1 to 5 of Example 1 and Comparative Example 1. The results are shown in Table 5.

TABLE 5

| thickness of surface side layer + thickness of substrate side layer = overall thickness (nm) | Sample | | | | | | | | |
|---|---|---|---|---|---|---|---|---|---|
| | #6 | #7 | #8 | #9 | #10 | #11 | #12 | #13 | #14 |
| (1) 8 + 2 nm = 10 nm | 0.019 | 0.017 | 0.012 | 0.008 | 0.067 | 0.055 | 0.033 | 0.015 | 0.007 |
| (2) 3 + 2 nm = 5 nm | 0.015 | 0.014 | 0.009 | 0.005 | 0.024 | 0.021 | 0.012 | 0.006 | 0.003 |
| (3) 5 + 5 nm = 10 nm | 0.039 | 0.033 | 0.020 | 0.011 | 0.051 | 0.042 | 0.025 | 0.012 | 0.007 |

Japanese Patent Application No. 2017-115879 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank which is processed into a transmissive photomask for use in photolithography for forming a pattern on a recipient using exposure light of wavelength up to 200 nm, the photomask blank comprising
a transparent substrate,
a first film disposed on the substrate and formed of a material which is etchable by chlorine/oxygen-based dry etching with a gas mixture of chlorine and oxygen gases and resistant against fluorine-based dry etching with a fluorine-containing gas, and
a second film disposed contiguous to the first film and formed of a silicon-containing material which is not substantially etched during the chlorine/oxygen-based dry etching of the first film and having a thickness of 2 nm to 10 nm,
said second film being a hard mask film and composed of multiple layers including
(A) a silicon dioxide ($SiO_2$) layer, and
(B) at least one layer comprising silicon and nitrogen and having a refractive index n of at least 1.6 or an extinction coefficient k of at least 0.3 with respect to the wavelength of inspection light used in a defect inspection step, which is longer than the exposure light, wherein
the difference in refractive index n with respect to inspection light wavelength between a layer having the highest refractive index and a layer having the lowest refractive index is at least 0.5, or the difference in extinction coefficient k with respect to inspection light wavelength between a layer having the highest extinction coefficient and a layer having the lowest extinction coefficient is at least 0.3.

2. The photomask blank of claim 1 wherein in the second film, a layer disposed remotest from the first film has a total content of oxygen and nitrogen and a layer disposed contiguous to the first film has a total content of oxygen and nitrogen, with the layer disposed remotest from the first film having a higher total content of oxygen and nitrogen than the layer disposed continuous to the first film.

3. The photomask blank of claim 1 wherein the defects are penetrating pinhole defects.

4. The photomask blank of claim 1 wherein the exposure light is ArF excimer laser light.

5. The photomask blank of claim 4 wherein the inspection light has a wavelength of up to 600 nm.

6. The photomask blank of claim 4 wherein the inspection light has a wavelength of 213 nm, 355 nm, 488 nm or 532 nm.

7. A method for preparing the photomask blank of claim 1, comprising the steps of
forming the first film on the substrate,
forming the second film on the first film, and
inspecting the photomask blank comprising the substrate and the first and second films for defects at the inspection light wavelength.

8. The photomask blank of claim 1 wherein the layer (B) having a refractive index n of at least 1.6 or an extinction coefficient k of at least 0.3 accounts for at least 20% of the total thickness of the second film.

9. The photomask blank of claim 1 wherein the layer (B) consists of silicon and nitrogen.

10. A photomask blank which is processed into a transmissive photomask for use in photolithography for forming a pattern on a recipient using exposure light of wavelength up to 200 nm, the photomask blank comprising
a transparent substrate,
a first film disposed on the substrate and formed of a material which is etchable by chlorine/oxygen-based dry etching with a gas mixture of chlorine and oxygen gases and resistant against fluorine-based dry etching with a fluorine-containing gas, and
a second film disposed contiguous to the first film and formed of a silicon-containing material which is not substantially etched during the chlorine/oxygen-based dry etching of the first film and having a thickness of 2 nm to 10 nm,
said second film being a hard mask film and composed of multiple layers including
(A) a silicon dioxide ($SiO_2$) layer, and
(B) at least one layer comprising silicon and nitrogen and having a refractive index n of at least 1.6 or an extinction coefficient k of at least 0.3 with respect to the wavelength of inspection light used in a defect inspection step, which is longer than the exposure light.

11. The photomask blank of claim 10 wherein in the second film, a layer disposed remotest from the first film has a total content of oxygen and nitrogen and a layer disposed contiguous to the first film has a total content of oxygen and nitrogen, with the layer disposed remotest from the first film having a higher total content of oxygen and nitrogen than the layer disposed continuous to the first film.

12. The photomask blank of claim 10 wherein the defects are penetrating pinhole defects.

13. The photomask blank of claim 10 wherein the exposure light is ArF excimer laser light.

14. The photomask blank of claim 13 wherein the inspection light has a wavelength of up to 600 nm.

15. The photomask blank of claim 13 wherein the inspection light has a wavelength of 213 nm, 355 nm, 488 nm or 532 nm.

16. The photomask blank of claim 10 wherein the layer (B) having a refractive index n of at least 1.6 or an extinction coefficient k of at least 0.3 accounts for at least 20% of the total thickness of the second film.

17. A method for preparing the photomask blank of claim 10, comprising the steps of
forming the first film on the substrate,
forming the second film on the first film, and
inspecting the photomask blank comprising the substrate and the first and second films for defects at the inspection light wavelength.

18. The photomask blank of claim 10 wherein the layer (B) consists of silicon and nitrogen.

* * * * *